(12) United States Patent
Horiuchi et al.

(10) Patent No.: US 6,522,017 B2
(45) Date of Patent: Feb. 18, 2003

(54) WIRING BOARD AND SEMICONDUCTOR DEVICE

(75) Inventors: Michio Horiuchi, Nagano (JP); Takashi Kurihara, Nagano (JP)

(73) Assignee: Shinko Electric Industries Co., Ltd., Nagano (JP)

( * ) Notice: Subject to any disclaimer, the term of this patent is extended or adjusted under 35 U.S.C. 154(b) by 0 days.

(21) Appl. No.: 09/797,887

(22) Filed: Mar. 2, 2001

(65) Prior Publication Data

US 2001/0020549 A1 Sep. 13, 2001

(30) Foreign Application Priority Data

Mar. 9, 2000 (JP) ........................................ 2000-071018

(51) Int. Cl.[7] .............................................. H01L 23/48
(52) U.S. Cl. ........................ 257/778; 257/737; 257/774
(58) Field of Search ................................. 257/778, 737, 257/738, 774

(56) References Cited

U.S. PATENT DOCUMENTS 6,011,312 A * 1/2000 Nakazawa et al. .......... 257/778

* cited by examiner

*Primary Examiner*—Roy Potter
(74) *Attorney, Agent, or Firm*—Paul & Paul

(57) ABSTRACT

Wiring board having a wiring layer to which electronic components are electrically connected, in through-holes closed at one of the ends thereof by the wiring layer are formed at predetermined positions of the wiring board, and a low melting point metal for electrically connecting the wiring layer to the electronic components is filled into the through-holes, and a semiconductor device using the same. The production methods of the wiring board and the semiconductor device are also disclosed.

11 Claims, 5 Drawing Sheets

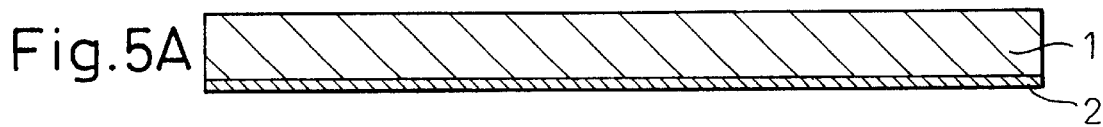
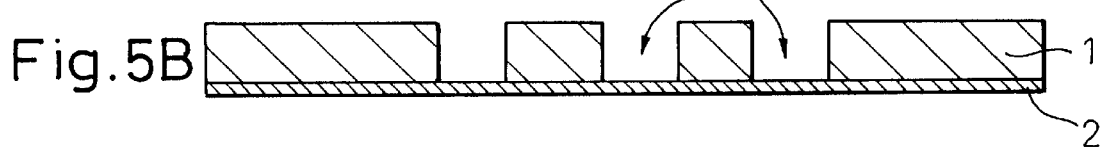
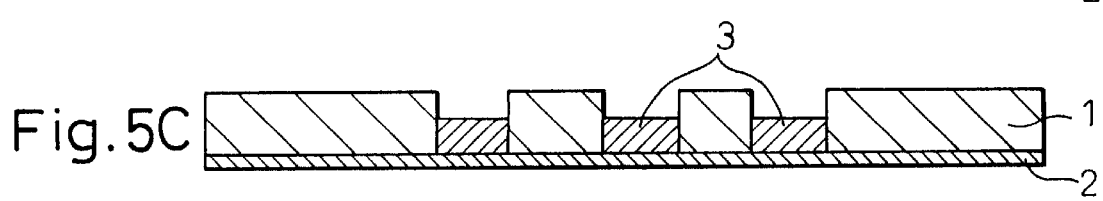
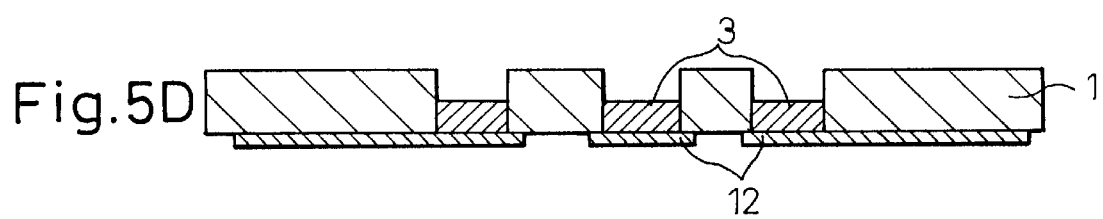
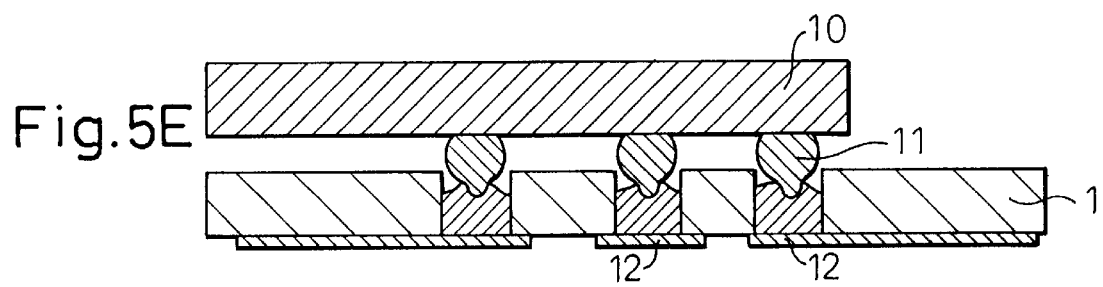
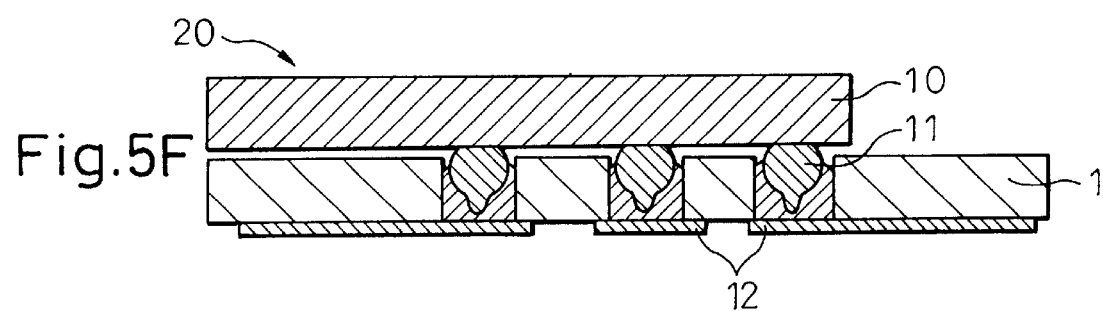

WIRING BOARD AND SEMICONDUCTOR DEVICE

BACKGROUND OF THE INVENTION

1. Field of the Invention

This invention relates to a packaging technology for electronic components. More specifically, this invention relates to a wiring board produced utilizing a bump mounting system, a semiconductor device and a method of producing them. Here, the term "electronic components" used in this specification means various components that can be electrically connected and mounted onto a wiring board or an insulating substrate having applied thereon conductive portions such as electrodes, wiring, and so forth. More concretely, the term "electronic components" represents semiconductor chips such as IC chips and LSI chips, passive devices, power sources, and so forth. The electric components may also be a wiring board and an insulating substrate equipped with a conductor portion so long as an "electric connection" referred to in the present invention can be accomplished.

2. Description of Related Art

Requirements for reduction in size, thickness and weight and for higher functions have been increasing, in recent years, in the field of electronic appliances such as personal computers, cellular telephones, PHS phones, and so forth. To satisfy these requirements, a technology for packaging electronic components at high density on a wiring board has been development and has been put into practical application.

Various technologies are known as high density packaging technologies. One of them is a bump mounting technology on which the present invention is based. When electronic components are mounted and connected electrically onto a wiring board, this technology avoids the use of connecting wires the wiring of which is complicated and which cannot cope with a complicated structure. Instead, according to the bump mounting technology, the electronic components are directly mounted through metal bumps onto the wiring board.

FIG. 1 is a cross-sectional view of a prior art semiconductor device produced by directly connecting a semiconductor chip to a wiring board through metal bumps. The semiconductor device 50 includes a wiring board 51 having electrode pads 52 of copper (Cu), and a semiconductor chip (an LSI chip, in this example) 61, as shown in the drawing. Metal bumps 62 of gold (Au) are disposed on electrodes (not shown) on the lower surface of the semiconductor chip 61 in such a fashion as to correspond to the electrode pads 52, respectively. The electrode pads 52 and the metal bumps 62 are electrically connected to one another through a low melting point metal (Ag—Sn alloy or Pb—Sn alloy) 53. The semiconductor chip 61 and the wiring board 51 are encapsulated with an electrically insulating thermosetting resin (epoxy resin) 54 to protect the resulting connections from external adverse influences.

The semiconductor device 50 shown in FIG. 1 can be produced preferably by a method shown in FIG. 2. First, the Au bumps 62 are formed at positions of the lower surface of the semiconductor chip 61 corresponding to the electrode pads 52. The Au bumps 62 can be formed on Au plating on the electrodes. Since the Au bumps 62 are stud bumps, they can be formed by a stud bump method. Alternatively, the semiconductor chip 61 equipped with such bumps is commercially available.

In the wiring board 51, on the other hand, the electrode pads 52 are formed by Cu plating, and then a low melting point metal (Ag—Sn alloy or Pb—Sn alloy) 53 is applied thereto. Then, the thermosetting epoxy resin 54 is applied to the entire surface of the wiring board 51. Next, the semiconductor chip 61 is mounted onto the wiring board 51 as shown in the drawing. A flip-chip bonding machine can be used to mount the chip. After completion of mounting of the chip, heating is conducted under pressure to simultaneously conduct bonding between the Au bumps 62 and the Ag—Sn or Pb—Sn alloy and setting of the epoxy resin 54. The heating temperature may be such that the Ag—Sn alloy or the Pb—Sn alloy can be molten and the epoxy resin can be sufficiently set. Generally, it is a temperature of not lower than 180° C. The semiconductor device shown in FIG. 1 can be obtained after a series of steps described above.

SUMMARY OF THE INVENTION

As described above, the connection method using the metal bumps can contribute to high-density packaging and to downsizing of semiconductor devices, but cannot sufficiently achieve reduction of the thickness of the devices. In other words, because the metal bumps are sandwiched between the wiring board and the semiconductor chip in this structure, the devices are likely to become thick.

It is therefore an object of the present invention to provide a wiring board that has a simple structure, provides reliable electric connection and moreover contributes greatly to the reduction in size and thickness of semiconductor devices.

It is another object of the present invention to provide a semiconductor device that has a simple construction and reliable electric connection and yet is small in both size and thickness.

It is still another object of the present invention to provide methods useful in the production of the wiring board and the semiconductor device according to the present invention.

These and other objects of the present invention will be understood easily from the following detailed description.

The inventors of the present invention have conducted intensive studies to accomplish the objects described above, and have acquired the knowledge that it is effective to employ a bump connection method as a connection method and at the same time to accommodate a main part of a bump connection portion within a substrate such as a wiring board. Based on this observation, the present inventors have thus completed the present invention which will be described below.

According to one aspect of the present invention, there is provided a wiring board having a wiring layer to which one or more electronic components are electrically connected, characterized in that one or more through-holes closed at one of the ends thereof by the wiring layer are formed at predetermined positions of the wiring board, and a low melting point metal for electrically connecting the wiring layer to the electronic components is filled into the through-holes.

According to another aspect of the present invention, there is provided a method of producing a wiring board having a wiring layer to which one or more electronic components are electrically connected, the method comprising the steps of forming one or more through-holes closed at one of the ends thereof by the wiring layer, at predetermined positions of the wiring board, and filling the through-holes with a low melting point metal for electrically connecting the wiring layer to the electronic components.

According to still another aspect of the present invention, there is provided a semiconductor device comprising a wiring board bearing a wiring layer having a predetermined pattern, on the lower surface thereof, and one or more semiconductor chips mounted onto the upper surface thereof, the wiring layer being electrically connected to metal bumps applied onto the semiconductor chip, characterized in that one or more through-holes closed at one of the ends thereof by the wiring layer are formed at predetermined positions of the wiring board, the metal bumps are fitted into the through-holes, and the wiring layer and the metal bumps are electrically connected to one another through a low melting point metal filled into the through-holes.

According to still another aspect of the present invention, there is provided a method of producing a semiconductor device comprising a wiring board bearing a wiring layer having a predetermined pattern, on the lower surface thereof and one or more semiconductor chips mounted to the upper surface thereof, the wiring layer being electrically connected to metal bumps applied onto the semiconductor chip, characterized in that the method comprises the steps of forming one or more through-holes closed at one of the ends thereof by the wiring layer, at predetermined positions of the wiring board; filling the through-holes with a low melting point metal for electrically connecting the wiring layer to the semiconductor chip; and inserting the metal bumps of the semiconductor chip into the low melting point metal contained in the through-holes, thereby mounting and electrically connecting the semiconductor chip onto the upper surface of the wiring board.

BRIEF DESCRIPTION OF THE DRAWINGS

FIGS. 5A to 5F are a cross-sectional view showing, in sequence, a production method of the semiconductor device shown in FIG. 3;

DESCRIPTION OF THE PREFERRED EMBODIMENTS

Figure 1:
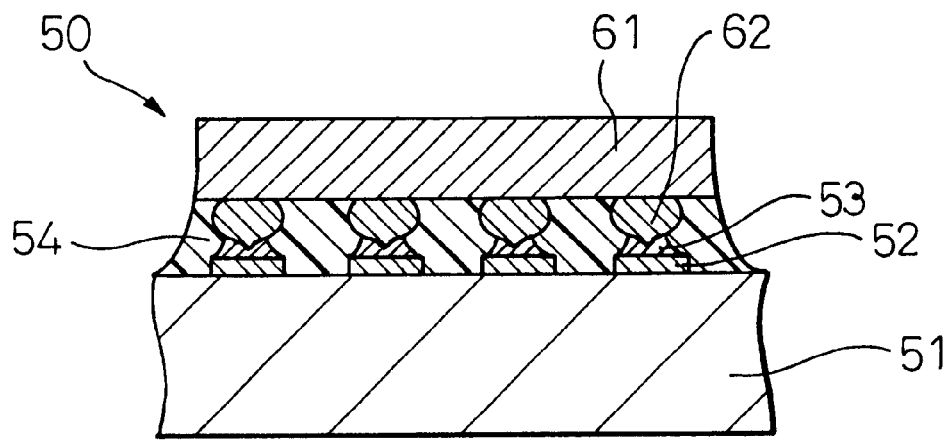
FIG. 1 is a cross-sectional view of a prior art semiconductor device employing a conventional bump connection method.
Figure 2:
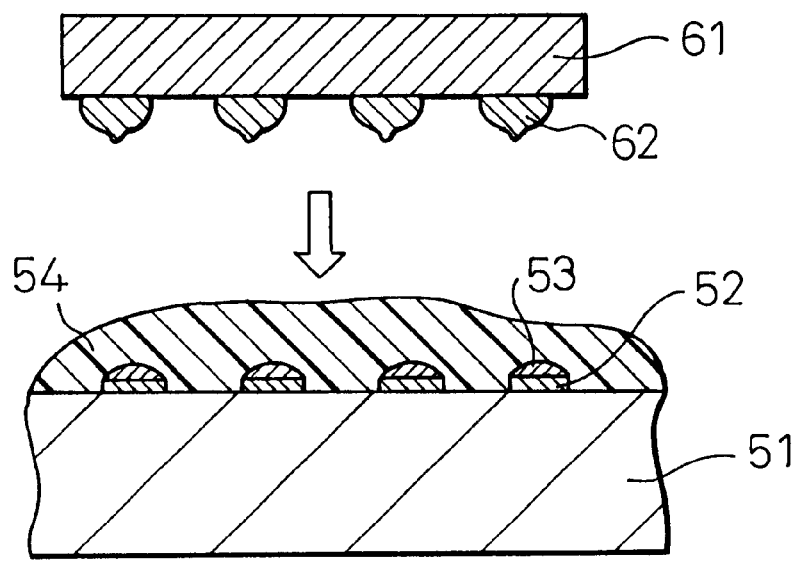
FIG. 2 is a cross-sectional view showing the basis of a production method of the semiconductor device shown in FIG. 1.

A wiring board according to the present invention includes, as its basic construction, a wiring layer which is formed into a predetermined pattern on an outer surface of or an inside of the board and to which electronic components are electrically connected. The wiring layer built in the wiring board is preferably a single layer, although it may include an multilayered structure. The wiring board has through-holes, that are closed at one of the ends thereof by the wiring layer, at predetermined portions of the board. A low melting point metal for electrically connecting the wiring layer to an electronic component is filled into each through-hole. Preferably, a substantial portion of each metal bump applied onto the electronic component is inserted into the low melting point metal contained in the through-holes in order to obtain a good connection of the wiring layer and the electronic component.

The wiring board according to the present invention can be produced by the steps of forming through-holes, that are closed at one of the ends thereof by a wiring layer, at predetermined positions of a wiring board, and then filling a low melting point metal, for electrically connecting the wiring layer to an electronic component, into the through-holes in a sufficient amount such that connection between the wiring layer and the electronic component can be established through the metal bumps when the metal bumps of the electronic component are fitted into the through-holes.

The wiring board of the present invention is not particularly limited so long as it has the basic construction described above, and can assume various forms within the scope of the present invention. Hereinafter, the wiring board inclusive of its production method will be explained concretely.

The electronic component includes various components used in electronic appliances as defined previously. The electronic component is typically a semiconductor chip. When a plurality of wiring boards are used in lamination, the electronic component may be the wiring board itself. The electronic component is preferably equipped at its predetermined positions with metal bumps for establishing electric connection with the wiring board. The distribution and number of the metal bumps can be changed arbitrarily depending on the connection positions and their number. Any other electrically conducting means may be used, in place of the metal bumps, whenever necessary.

The metal bumps of the electronic component may be any arbitrary metal bumps that are generally used in the field of electronic packaging. The metal bumps are generally formed on an electrode (made of aluminum, for example) of each electronic component, but may be formed at a position other than the electrode either directly or through a suitable conductive metal. Examples of the metal bump are ball bumps formed by electrolytic plating or vacuum evaporation of gold (Au), nickel (Ni), copper (Cu), a high melting point solder (Pb/Sn), or the like, and stud bumps formed from gold (Au) by a wire bonding method, though these examples are not particularly limitative. The Au stud bumps formed by an Au ball bond wire tear-off method can be used particularly advantageously in the practice of the present invention.

On the other hand, the wiring board can take various embodiments or forms known in this technical field. For example, the wring board can take the form of a TAB tape comprising an insulating substrate and a wiring layer supported by this substrate. The TAB tape preferably has the wiring layer formed by bonding a copper foil on the substrate, and is generally a three-layered tape having the copper foil bonded through an adhesive layer. Copper may be deposited to the surface of the substrate by sputtering or similar depositing means to form the wiring layer without using the adhesive, if desired.

Explanation will be given in further detail. Various insulating plastic materials can be used as the substrate of the TAB tape and other wiring board, but a polyimide resin can be used particularly advantageously in view of its good heat resistance, high strength, etc. When it is desired to obtain a rigid tape, plastic materials reinforced by reinforcing materials such as a glass fiber and Kevlar™ fiber, and a glass reinforced polyimide resin, a glass reinforced epoxy resin, a glass reinforced bismaleimide triazine (BT) resin and a glass reinforced polyphenylene ether (PPE) resin can be advantageously used. Ceramic materials, too, can be used as the substrate in place of these plastic materials, whenever necessary.

When the wiring board in the form of the TAB tape is produced, for example, the substrate described above can be used advantageously in the form of a tape-like substrate. The thickness of the tape-like substrate used can be widely changed depending on the configuration and size of the semiconductor device and others to which the TAB tape is applied, etc, but it is generally from about 50 to about 150 $\mu$m, and preferably in the range of about 75 to 100 $\mu$m.

A thin film or a film of various conductive metals (hereinafter called also the "metal layer") such as copper or aluminum can be used in the formation of the wiring layer. A copper foil, in particular, can be used appropriately as the wiring layer-forming material. The thickness of the copper foil is generally from about 10 to about 30 $\mu$m, and preferably an order of about 20 $\mu$m. Plating of a conductive metal is preferably applied to one, or both, of the surfaces of the copper foil in order to prevent it from being oxidized and from failing to achieve sufficient connection, and to insure bonding between the wiring layer formed from the copper foil (such as lead, wire, electrode, etc) and other components. Examples of suitable metal plating include gold plating, silver plating, tin plating and nickel plating. Preferred among them is gold plating. Though the thickness of such metal plating can be changed over a broad range, it is generally an order of about 1 $\mu$m.

A conventional adhesive in the production of semiconductor devices is used for bonding the copper foil described above to the substrate. A suitable example of such an adhesive is a thermosetting epoxy adhesive because it has excellent adhesion and heat resistance. The thickness of the adhesive layer formed from such an adhesive can be changed widely depending on the kind of the adhesive used, the kind of the conductor portion to be bonded to the substrate by using the adhesive and a desired bonding strength. However, it is generally from about 10 to about 40 $\mu$m. The adhesive layer may be formed by applying a suitable adhesive from a solution, or by bonding a sheet-like adhesive.

The unnecessary portions of the copper foil bonded to the surface of the substrate are removed to form a desired wiring layer, that is, leads (inner leads connected to the electrodes of the semiconductor chip and outer leads connected to the electrodes of a package or substrate), wiring, and electrodes. This step can be conducted advantageously in accordance with an etching process that is customary in the production of semiconductor devices. In other words, an etching resist is selectively applied to an area of the copper foil to be left as the wiring layer, and an exposed unnecessary copper foil is dissolved away by a suitable etching solution such as an aqueous ferric chloride solution. The copper foil plating step described above may be consecutively conducted after this etching step, if necessary.

The wiring layer can be produced as a patterned product having a desired pattern by using a conventional thin film formation method such as sputtering, vacuum deposition, and so forth, if necessary. When such a conventional method is used, a wiring pattern having a small and uniform thickness can be formed accurately, and the adhesive described above becomes unnecessary because of a good bonding strength of the resulting wiring pattern.

The wiring board according to the present invention must essentially have one or more through-holes at predetermined position(s). A metal bump of an electronic component is preferably inserted and fitted into each through-hole. The through-hole generally takes the structure in which it extends throughout the board in its thickness-wise direction, and is closed at its end by the wiring layer. When the wiring layer is formed inside the board, one end of the through-hole may terminate at the wiring layer disposed inside. The diameter of the through-holes may be changed depending on the size of the metal bump to be inserted, and is generally from about 0.5 to about 1.5 mm.

A dedicated jig such as a drill or a punch may be preferably used to form the through-holes. For example, while the positions other than the through-holes are masked with a plating resist, drilling or plasma etching with a $CO_2$ laser or an excimer laser is carried out advantageously. The formation of the through-holes is generally and preferably carried out after the copper foil is bonded to the surface of the board to form the wiring board, or the copper foil is further etched to form the wiring layer. However, the formation of the through-holes may be conducted before the copper foil is bonded to the board, whenever necessary.

In the wiring board according to the present invention, a low melting point metal is filled into the through-holes at a predetermined height of the filled metal, that is, in an amount sufficient to electrically connect the wiring layer and the electronic component through the metal bump in the through-holes. An optimum amount of the filled metal is determined in consideration of the capacity of the through-hole and the size of the metal bump. The low melting point metal includes various metals, but Ag—Sn alloy, Sn—Pb alloy, Sn—Cu—Ag alloy, and other solders can be suitably used as the low melting point metal. The solders can be preferably filled by electrolytic plating. The explanation of plating in detail will be omitted because the electrolytic plating is conventional and well-known. Note, however, in the practice of the present invention that since the board itself can serve as a solder resist, the step of masking the positions other than the solder-filling portions by a plating resist layer can be omitted contrary to the conventional electrolytic plating.

After the low melting point metal was filled into the through-holes, an electronic component, preferably a semiconductor chip, is mounted to the wiring board in such a fashion that the metal bumps previously provided to the chip are inserted and fitted into corresponding through-holes. The metal bumps are preferably inserted to a depth such that substantially the whole part of each bump is fitted into the corresponding through-hole, and such that the surface of the low melting point metal filled into the through-hole rises as a result of insertion of the metal bump and approaches the end face at the upper end of the through-hole. Furthermore, this fitting work of the metal bump is generally and preferably conducted while heating is carried out to a temperature near the melting point of the low melting point metal. In the wiring board of the present invention, the through-holes of the board can also act as the guide for inserting the metal bumps. In consequence, connection can be achieved more rapidly and more reliably.

The wiring board according to the present invention is obtained through the series of production steps described above. In this wiring board, the portions ranging between the wiring board and the electronic components on the board may be encapsulated by an inorganic or organic electrically insulating resin, preferably an organic resin such as an epoxy resin or polyimide resin, if necessary. When such an encapsulating resin is applied, the connection portions can be protected from surrounding adverse influences. The encapsulation using the resin is preferably carried out by applying a suitable encapsulation resin at a suitable thickness to the board, followed by curing the resin simultaneously with fitting under pressure of the metal bumps and heating of the metal bumps after the low melting point metal was filled into the through-holes, but before the metal bumps are inserted into the corresponding through-holes. The encapsulation resin may be post-cured, if necessary.

The present invention provides a semiconductor device in addition to the wiring board described above. The semiconductor device according to the present invention comprises a wiring board having equipped on its lower surface a wiring layer having a predetermined pattern, and a semiconductor chip mounted to the upper surface of the wiring board.

The semiconductor device according to the present invention has a construction in which one or more semiconductor chips are mounted to the wiring board described above. In other words, it has the construction wherein:

(1) the semiconductor chip and the wiring layer of the wiring board are electrically connected through the metal bumps provided to the semiconductor chip;

(2) the through-holes closed at one of the ends thereof by the wiring layer are formed at predetermined positions of the wiring board;

(3) the low melting point metal is filled into each through-hole in an amount sufficient to electrically connect the wiring layer and the semiconductor chip through the metal bump of the semiconductor chip; and (4) the metal bump is inserted into the low melting point metal filled in each through-hole.

Since the construction of the semiconductor device of the present invention is based on the wiring board described above, the semiconductor device can be preferably produced by a method similar to the production method of the wiring board. To produce the semiconductor device of the present invention, through-holes closed at one of the ends thereof by a wiring layer are formed at predetermined positions of a wiring board. Here, the wiring layer can be formed by an arbitrary method in the same way as the wiring layer of the wiring board. The wiring layer and the through-holes can be formed at arbitrary timings, respectively.

Next, a low melting point metal is filled into each through-hole thus formed. The low melting point metal used, its filling method and its filling amount are the same as those used in the case of the production of the wiring board.

After the low melting point metal was filled, a metal bump of a semiconductor cell is inserted and fitted to the low melting point metal of each through-hole of the wiring board, and the semiconductor chip is mounted and connected electrically to the upper surface of the wiring board. In this mounting step of the semiconductor chip, it is preferred to mount the semiconductor chip onto the wiring board and to fit the metal bumps into the corresponding through-holes while heating is done, under pressure, to or above the melting point of the low melting point metal, in the same way as in the production of the wiring board.

The semiconductor chip mounted to the wiring board in the semiconductor device according to the present invention is not particularly limited, and may be any chip used generally in the production of the semiconductor devices. Examples of suitable semiconductor chips include LSI chips and VLSI chips. The size of such semiconductor chips may vary with the kind of the chips, but is generally from about 40 to about 50 $\mu$m for thin chips and up to about 500 $\mu$m for thick chips.

According to the present invention, it is also possible to produce a composite or laminated semiconductor device, if necessary, by mounting at least one, generally two or more, semiconductor chips onto respective wiring boards, followed by laminating these wiring boards and connecting them electrically to one another. The composite semiconductor device may include various types. It is generally preferred, however, to stack the devices having the same size in the thickness wise direction and to connect them electrically by the connection method that uses the metal bumps of the present invention. Such a composite semiconductor device is particularly useful as a memory module, or the like.

The semiconductor device provided by the present invention can be advantageously used in portable electric and electronic appliances such as cellular telephones and personal computers, particularly portable personal computers.

EXAMPLES

Next, examples of the present invention will be explained with reference to the accompanying drawings. Note, however, that the examples shown in the drawings represent typical embodiments, and various changes and modifications can be made thereto within the scope of the present invention.

Figure 3:
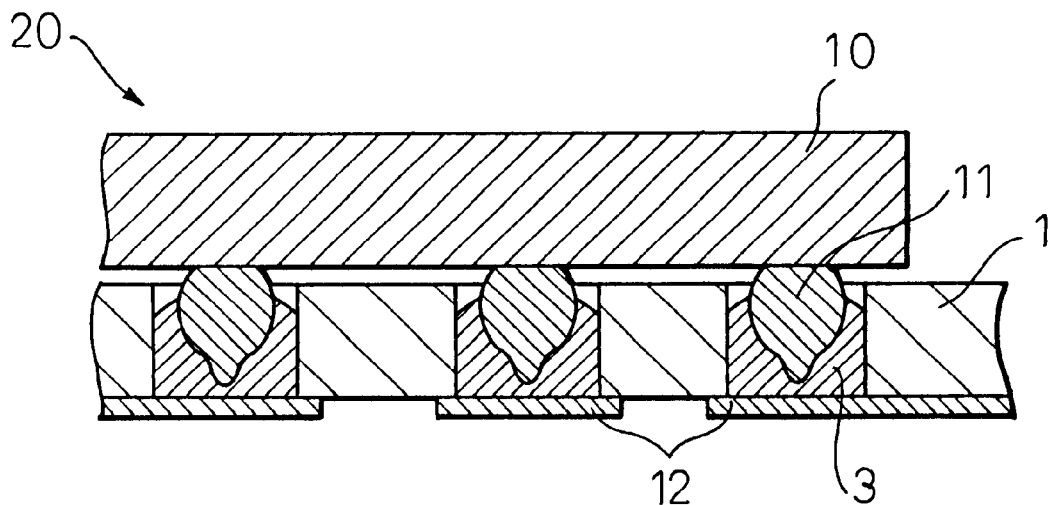
FIG. 3 is a cross-sectional view showing a preferred embodiment of a semiconductor device, employing a bump connection system, according to the present invention.

FIG. 3 is a cross-sectional view that shows a preferred example of a semiconductor device employing the bump connection system according to the present invention. The semiconductor device 20 includes a wiring board comprising an insulating ceramic substrate 1 having applied thereon a wiring layer (wiring pattern) 12 made of copper (Cu). The wiring pattern 12 of the wiring board is bonded to the substrate 1 through an adhesive layer (not shown). Of course, the adhesive layer may be omitted if the wiring pattern 12 is formed by sputtering or the like. A semiconductor chip (here, an LSI chip) 10 is mounted onto the substrate 1 and electrically connected to the substrate 1 through metal bumps 11. In other words, the metal bumps 11 made of gold (Au) are formed on electrodes (not shown) on the lower surface of the semiconductor chip 10 in such a fashion as to correspond to through-holes that will be opened explained next, respectively. The through-holes are opened at positions of the substrate 1, into which the metal bumps 11 should be inserted and fitted. As is illustrated, the distal end of each through-hole is closed by a wiring pattern 12. A low melting point metal (solder, i.e., Ag—Sn alloy) 3 is contained in each through-hole at a predetermined filling height. Therefore, when the low melting point metal 3 is molten and the metal bump 11 is inserted into the molten metal portion in accordance with the present invention, the wiring pattern 12 and the metal bump 11 can be electrically connected to each other through the low melting point metal 3 after the low melting point metal 3 is solidified.

Figure 4:
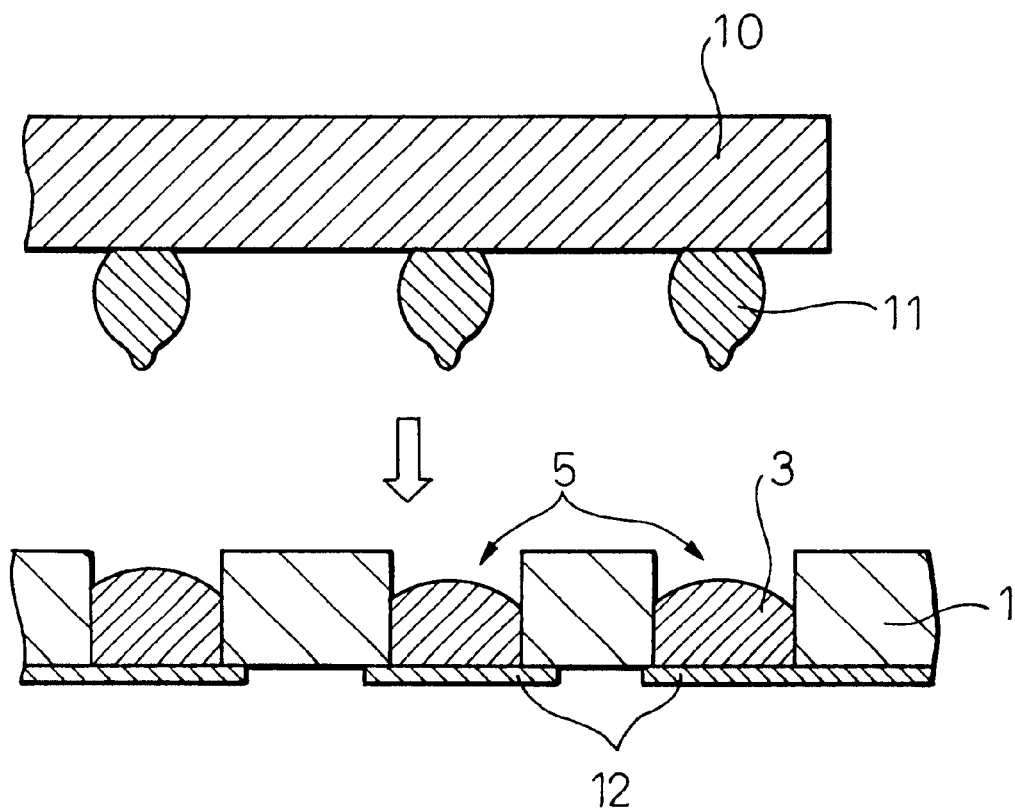
FIG. 4 is a cross-sectional view showing the basis of a production method of the semiconductor device shown in FIG. 3.

The principle of the production method of the semiconductor device shown in FIG. 3 will be easily appreciated from the cross-sectional view of FIG. 4. First, Au bumps 11 are formed at positions on the lower surface of the semiconductor chip 10 that correspond to the through-holes 5 of the substrate 1, respectively. The Au plating is applied onto the electrodes (not shown) of the semiconductor chip 10 to form the Au bumps 11. Since the resulting Au bumps 11 are stud bumps, a bonding wire tear-off method can be used to form the Au bumps 11. Incidentally, the semiconductor chip 10 having such bumps 11 is commercially available from manufacturers of semiconductor devices, if desired.

On the other hand, the ceramic substrate 1 is provided. The substrate 1 used herein has the patterned Cu wiring pattern 12 on one of the surfaces of the substrate 1 and through-holes 5 are so formed as to reach the Cu wiring pattern 12. The low melting point metal (Ag—Sn alloy) is contained in each through-hole 5 at a predetermined filling height. The semiconductor chip 10 is then put on the substrate 1 and its Au bumps 11 are inserted and fitted into the corresponding through-holes 5 of the substrate 1 as shown in the drawing. In this instance, heating is conducted under application of a pressure to accomplish electric connection at a desired high level and to firmly bond the Au bumps 11 to the Ag—Sn alloy 3. The heating temperature is a temperature sufficient to melt the Ag—Sn alloy, and is generally around 220° C. The semiconductor device shown in FIG. 3 can be obtained after a series of production steps described above.

FIGS. 5A to 5F illustrate, in sequence, the production process of the semiconductor device explained with reference to FIG. 4 to assist in further understanding of the present invention.

First, a Cu foil 2 is bonded to a ceramic substrate 1 as shown in FIG. 5A. To bond the Cu foil 2, it is possible to employ a method that applies an adhesive layer (not shown) to the substrate 1, then bonds the Cu foil 2, heats and softens the adhesive layer to an elevated temperature and then cures the adhesive layer.

In the next step, shown in FIG. 5B, drilling is conducted to form through-holes 5 at predetermined positions of the substrate 1. Here, laser drilling using an excimer laser is employed. The through-holes 5 are so formed as to terminate one end of the through-holes 5 at the surface of the Cu foil 2. In other words, each through-hole 5 is open at one of its ends and is closed at the other end by the Cu foil 2.

After formation of the through-holes 5, a solder alloy (an Ag—Sn alloy in this case) 3 is filled to an intermediate part of each through-hole 5 by an electrolytic plating using the Cu foil 2 as the electrode as shown in FIG. 5C. Incidentally, the substrate 1 can serve as a solder resist in this electrolytic plating step.

Next, unnecessary portions of the Cu foil 2 are dissolved away to form the wiring layer (wiring pattern) 12 as shown in FIG. 5D. Although not shown, this process can be carried out by applying an etching resist corresponding to a desired wiring pattern on the Cu foil 2, followed by curing the same. Then, the unnecessary portions of the Cu foil 2 not covered with the resist film are etched away by a suitable etchant (an aqueous solution of ferric chloride in this case). The used resist film is dissolved off by a suitable solvent. Alternatively, a solder resist layer may be formed on the wiring pattern, if necessary.

Subsequently, in the step of FIG. 5E, the process explained above with reference to FIG. 4 is carried out. In other words, the semiconductor chip 10 is put on the substrate 1, and the Au bumps 11 are inserted and fitted into the corresponding through-holes 5 of the substrate 1 at an elevated temperature under application of pressure. The heating temperature is about 220° C. The Ag—Sn alloy 3 is molten and is upwardly moved to close the upper region of the through-hole 5 with insertion of the Au bump 11. In consequence, the Au bump 11 is buried substantially wholly inside the mass of the Ag—Sn alloy 3.

When the Ag—Sn alloy is solidified, the same semiconductor device 20 as the one shown in FIG. 3 can be obtained as is shown in FIG. 5F.

Figure 6:
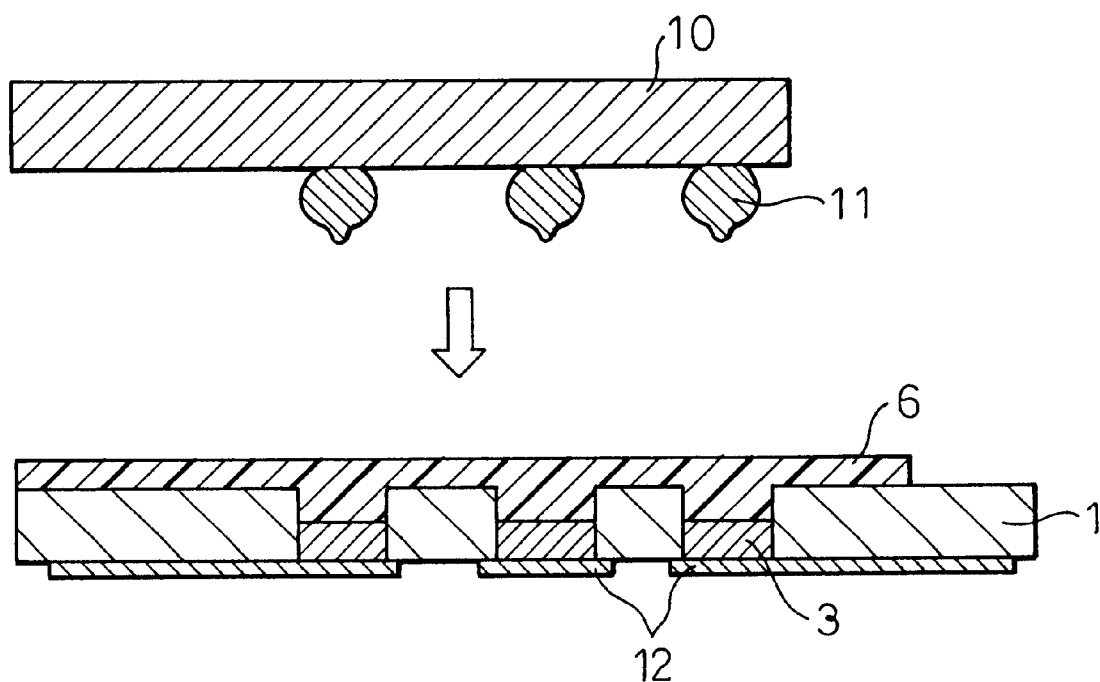
FIG. 6 is a cross-sectional view showing a modified example of the production method shown in FIGS. 5A to 5F.

FIG. 6 shows a modified example of the production process of the semiconductor device according to the present invention explained above with reference to FIGS. 5A to 5F.

In this example, an electrically insulating organic resin (an epoxy resin in this case) 6 is sandwiched between the substrate 1 and the semiconductor chip 10 in order to protect the electrical connection produced upon the present invention. In other words, the epoxy resin 6 is applied at a predetermined thickness as shown in the drawing, after filling of the Ag—Sn alloy 3 as shown in FIG. 5D and before insertion of the Au bump 11 into the through hole 5 as shown in FIG. 5E.

Figure 7:
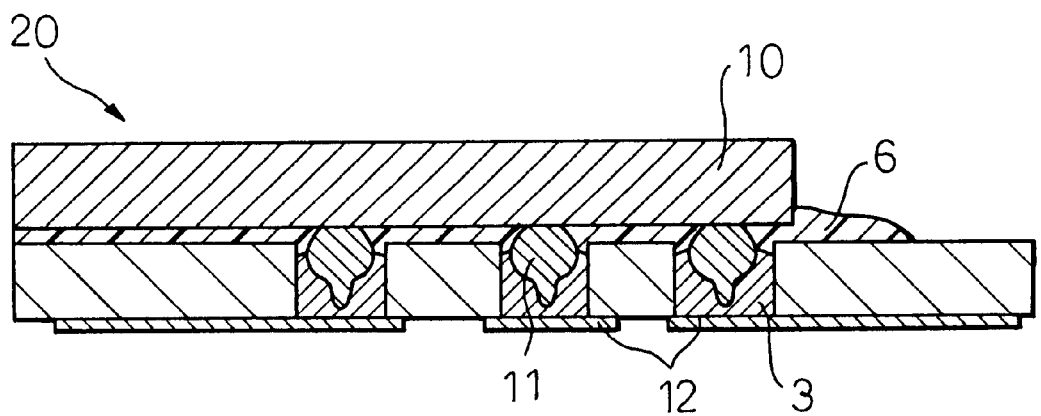
FIG. 7 is a cross-sectional view showing the semiconductor device produced by the production method shown in FIG. 6.

Subsequently, the Au bumps 11 are inserted and fitted into the corresponding through-holes 5 of the substrate 1 at an elevated temperature and under application of pressure in the same way as the step described above with reference to FIG. 5E. Then, the Ag—Sn alloy 3 is molten, and the Au bumps 11 are buried substantially wholly into the mass of the Ag—Sn alloy 3 and are solidified. At the same time, the epoxy resin 6 extends between the substrate 1 and the semiconductor chip 10 and is cured. As a result, the semiconductor device 20, the connection portions of which are encapsulated with the epoxy resin 6, can be obtained as shown in FIG. 7.

Figure 8A:
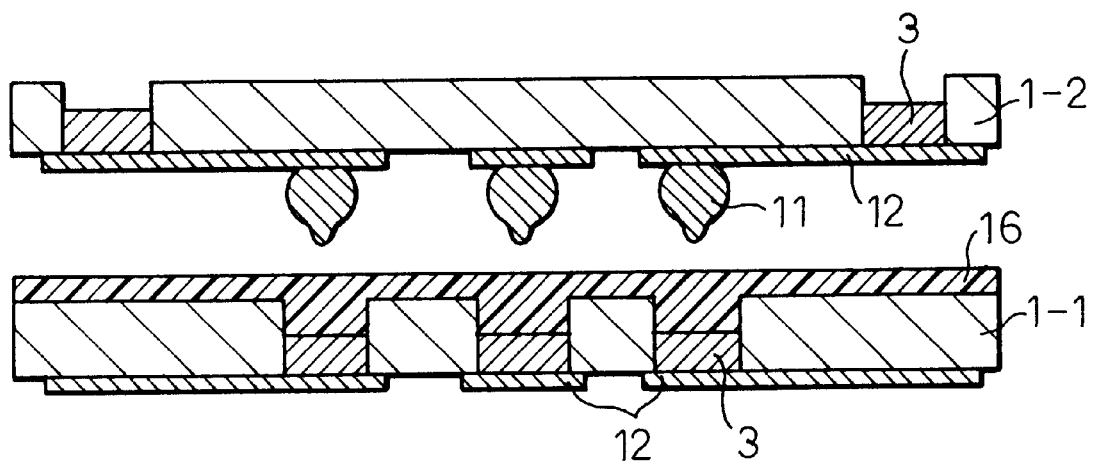
FIGS. 8A and 8B are a cross-sectional view showing, in sequence, a production method of a laminated wiring substrate according to the present invention.
Figure 8B:
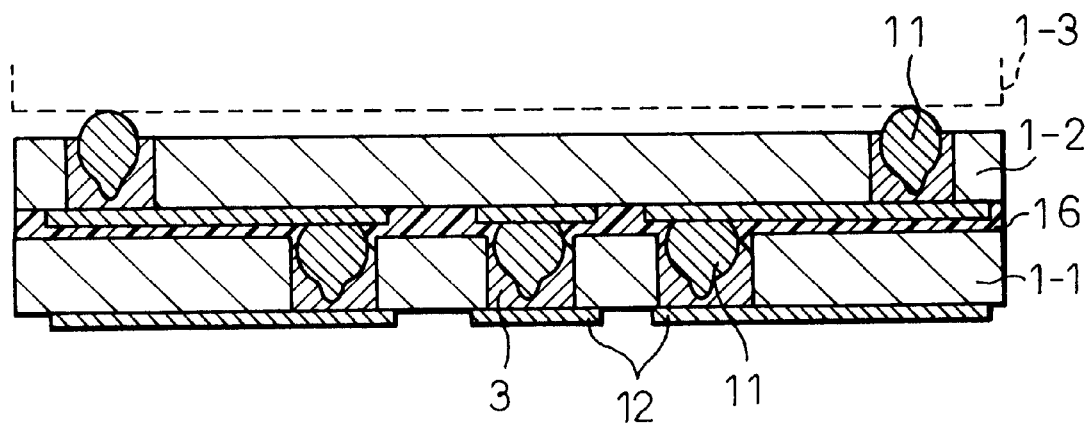

FIGS. 8A and 8B shows an example where a composite wiring substrate is produced by laminating a plurality of wiring boards. After a resin 16 as a binding material is applied to one wiring substrate 1-1 as shown in FIG. 8A, another wiring substrate 1-2 is laminated in the same way as explained above with reference to FIGS. 5A to 5F. After completion of a series of production steps, a wiring board having further a wiring substrate 1-3 can be obtained as shown in FIG. 8B.

Finally, it should be noted that the construction of the semiconductor device described above covers only limited embodiments of the present invention, and various changes and improvements can of course be made to the present invention within its scope.

In summary, as explained above, the present invention employs a system for inserting and fitting the metal bumps into the through-holes of the wiring board. Therefore, the resulting connecting structure is thin and its thickness can be easily controlled. Since the through-holes can serve also as the guiding means during the connection process, connection can be conducted more easily and more rapidly, with a high reliability. Further, since the board itself can serve also as the solder resist, the solder resist layer that has been necessary in the prior art bump connection system can be omitted, and the connection structure and its production can be simplified.

In addition, owing to the remarkable effects described above, the present invention can provide a small and thin semiconductor device.

What is claimed is:

1. A wiring board having a wiring layer to which one ore more electronic components are electrically connected, in which one or more through-holes closed at one of the ends thereof by said wiring layer are formed at predetermined positions of said wiring board, and a low melting point metal for electrically connecting said wiring layer to said electronic components is filled in said through-holes in which said through-holes have a configuration and size sufficient to receive a substantial portion of a metal bump of said electronic components.

2. The wiring board according to claim 1, in which said through-holes have a configuration and size sufficient to receive a substantial portion of a metal bump of said electronic components.

3. The wiring board according to claim to claim 1, in which said low melting point metal is filled in said through-holes in an amount sufficient to ensure electrical connection of said wiring layer, through said metal bump, with said electronic components when said metal bump is received in said low melting point metal-filled through-holes.

4. The wiring board according to claim 1, in which said low melting point metal is a solder of Ag—Sn alloy, Sn—Pb alloy or Sn—Cu—Ag alloy.

5. The wiring board according to claim 1, in which said wiring layer is a patterned layer of electrically conductive metal and is positioned on a surface of or within an interior of a substrate of said wiring board.

6. The wiring board according to claim 1, in which said electronic components are semiconductor chips.

7. The wiring board according to claim 1, in which said electronic components are wiring layers applied on a surface of another wiring board.

8. A semiconductor device comprising a wiring board bearing a wiring layer having a predetermined pattern, on the lower surface thereof, and one or more semiconductor chips mounted onto the upper surface thereof, said wiring layer being electrically connected to metal bumps applied onto said semiconductor chip, in which one or more through-holes, closed at one of the ends thereof by said wiring layer are formed at predetermined positions of said wiring board, said metal bumps are fitted into said through-holes, and said wiring layer is electrically connected with said metal bumps through a low melting point metal filled into said through-holes.

9. The semiconductor device according to claim 8, in which said wiring layer is a patterned metal layer bonded to an insulating substrate of said wiring board.

10. The semiconductor device according to claim 8, in which said metal bumps are a stud bump formed by a wire bonding method.

11. The semiconductor device according to claim 8, in which at least a portion ranging between said wiring board and said semiconductor chip is encapsulated with an insulating resin.

* * * * *